(12) United States Patent
Kang et al.

(10) Patent No.: US 9,570,434 B2
(45) Date of Patent: Feb. 14, 2017

(54) SEMICONDUCTOR DEVICE AND FABRICATING METHOD THEREOF

(71) Applicant: SAMSUNG ELECTRONICS CO., LTD., Suwon-si, Gyeonggi-Do (KR)

(72) Inventors: Hyun-Jae Kang, Gunpo-si (KR); Jin-Wook Lee, Seoul (KR); Kang-Ill Seo, Chungcheongbuk-Do (KR); Yong-Min Cho, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/217,531

(22) Filed: Jul. 22, 2016

(65) Prior Publication Data

US 2016/0329314 A1 Nov. 10, 2016

Related U.S. Application Data

(63) Continuation of application No. 14/539,579, filed on Nov. 12, 2014, now Pat. No. 9,418,896.

(51) Int. Cl.
| | |
|---|---|
| *H01L 27/088* | (2006.01) |
| *H01L 27/02* | (2006.01) |
| *H01L 23/522* | (2006.01) |
| *H01L 21/768* | (2006.01) |
| *H01L 21/8234* | (2006.01) |

(52) U.S. Cl.
CPC ..... *H01L 27/0207* (2013.01); *H01L 21/76816* (2013.01); *H01L 21/76877* (2013.01); *H01L 21/823431* (2013.01); *H01L 21/823475* (2013.01); *H01L 23/5226* (2013.01); *H01L 27/0886* (2013.01)

(58) Field of Classification Search
CPC ............. H01L 27/0207; H01L 27/0886; H01L 21/76816; H01L 21/76877; H01L 21/823431; H01L 23/5226
USPC ........................................................ 257/401
See application file for complete search history.

(56) References Cited

U.S. PATENT DOCUMENTS 7,315,994 B2 1/2008 Aller et al.
7,847,320 B2 12/2010 Anderson et al.
(Continued)

FOREIGN PATENT DOCUMENTS

JP 2008-004664 1/2008

*Primary Examiner* — Trung Q Dang
(74) *Attorney, Agent, or Firm* — F. Chau & Associates, LLC

(57) ABSTRACT

Provided are a semiconductor device and a fabricating method thereof. The fabricating method includes forming first to fourth fins, each extending in a first direction, to be spaced apart in a second direction intersecting the first direction, forming first and second gate lines, each extending in the second direction, on the first to fourth fins to be spaced apart in the first direction, forming a first contact on the first gate line between the first and second fins, forming a second contact on the first gate line between the third and fourth fins, forming a third contact on the second gate line between the first and second fins, forming a fourth contact on the second gate line between the third and fourth fins and forming a fifth contact on the first to fourth contacts so as to overlap with the second contact and the third contact and so as not to overlap with the first contact and the fourth contact, wherein the fifth contact is arranged to diagonally traverse a quadrangle defined by the first to fourth contacts.

20 Claims, 22 Drawing Sheets

(56) References Cited

U.S. PATENT DOCUMENTS

| | | |
|---|---|---|
| 8,129,771 B2 | 3/2012 | Yokoyama |
| 8,258,572 B2 | 9/2012 | Liaw |
| 8,552,508 B2 | 10/2013 | Becker et al. |
| 2004/0196705 A1* | 10/2004 | Ishikura ................. H01L 27/11 365/200 |
| 2007/0080423 A1* | 4/2007 | Tsuboi ................... H01L 27/11 257/506 |
| 2009/0014806 A1* | 1/2009 | Ostermayr ...... H01L 21/823807 257/369 |
| 2011/0018064 A1 | 1/2011 | Doornbos |
| 2011/0024828 A1* | 2/2011 | Takeuchi ........... H01L 27/0207 257/329 |
| 2011/0195564 A1 | 8/2011 | Liaw et al. |
| 2013/0175627 A1 | 7/2013 | Goldbach et al. |
| 2013/0181297 A1 | 7/2013 | Liaw |
| 2013/0200395 A1 | 8/2013 | Liaw et al. |
| 2014/0131813 A1 | 5/2014 | Liaw |
| 2014/0254246 A1 | 9/2014 | Liaw |
| 2016/0133522 A1 | 5/2016 | Kang et al. |

* cited by examiner

SEMICONDUCTOR DEVICE AND FABRICATING METHOD THEREOF

CROSS-REFERENCE TO RELATED APPLICATION

This application is a continuation of U.S. application Ser. No. 14/539,579, filed on Nov. 12, 2014, the disclosure of which is incorporated by reference herein in its entirety.

TECHNICAL FIELD

The present inventive concept relates to a semiconductor device and a fabricating method thereof.

DISCUSSION OF RELATED ART

A logic cell of a semiconductor device is an integrated body of a semiconductor circuit for performing a specific function. This logic cell is variously designed in advance by being individually modularized and optimized to satisfy certain constraint conditions. This pre-designed logic cell is called a standard cell. By using various standard cells, a designer can design a desired circuit.

Among these standard cells, the minimum standard of a logic cell constituting a standard cell by using 9 back end of line (BEOL) tracks is called a 9-track standard cell.

In the case of the standard cell, there are constraints in the design rules to effectively utilize a space. Along with the development of miniaturization and integration of semiconductor devices, a critical dimension of the design rules is getting smaller. Accordingly, a margin may be secured, i.e., a minimum distance between patterns, in the ground rules to prevent a short circuit between internal patterns. To secure the minimum distance, constraint conditions such as uniformity of distribution of critical dimensions and line edge roughness (LER) of patterns may be desired.

SUMMARY

Aspects of the present inventive concept provide a fabricating method of a semiconductor device having an optimal margin between contact patterns under constraint conditions of the design rules.

Aspects of the present inventive concept also provide a semiconductor device having an optimal margin between contact patterns under constraint conditions of the design rules.

However, aspects of the present inventive concept are not restricted to those set forth herein. The above and other aspects of the present inventive concept will become more apparent to one of ordinary skill in the art to which the present inventive concept pertains by referencing the detailed description of the present inventive concept given below.

In one aspect of the present inventive concept, there is provided a method for fabricating a semiconductor device including forming first to fourth fins, each extending in a first direction, to be spaced apart in a second direction intersecting the first direction, forming first and second gate lines, each extending in the second direction, on the first to fourth fins to be spaced apart in the first direction, forming a first contact on the first gate line between the first and second fins, forming a second contact on the first gate line between the third and fourth fins, forming a third contact on the second gate line between the first and second fins, forming a fourth contact on the second gate line between the third and fourth fins; and forming a fifth contact on the first to fourth contacts so as to overlap with the second contact and the third contact and so as not to overlap with the first contact and the fourth contact, wherein the fifth contact is arranged to diagonally traverse a quadrangle defined by the first to fourth contacts.

In one aspect of the present inventive concept, there is provided a method for fabricating a semiconductor device comprising including forming a plurality of fins, each extending in a first direction, to be spaced apart in a second direction intersecting the first direction, forming a plurality of gate lines, each extending in the second direction, on the plurality of fins to be spaced apart in the first direction, in a first region including first to fourth fins among the plurality of fins and first and second gate lines among the plurality of gate lines, forming a first contact on the first gate line between the first and second fins, forming a second contact on the first gate line between the third and fourth fins in the first region, forming a third contact on the second gate line between the first and second fins in the first region, forming a fourth contact on the second gate line between the third and fourth fins in the first region, forming a fifth contact on the first to fourth contacts in the first region so as to overlap with the second contact and the third contact and so as not to overlap with the first contact and the fourth contact and forming a sixth contact between the plurality of gate lines in a second region which does not overlap with the first to fourth fins, wherein the fifth contact is arranged to diagonally traverse a quadrangle defined by the first to fourth contacts.

In one aspect of the present inventive concept, there is provided a semiconductor device including first to fourth fins, each extending in a first direction, arranged to be spaced apart in a second direction intersecting the first direction, first and second gate lines, each extending in the second direction, arranged on the first to fourth fins to be spaced apart in the first direction, a first contact formed on the first gate line between the first and second fins, a second contact formed on the first gate line between the third and fourth fins, a third contact formed on the second gate line between the first and second fins, a fourth contact formed on the second gate line between the third and fourth fins and a fifth contact formed on the first to fourth contacts so as to overlap with the second contact and the third contact and so as not to overlap with the first contact and the fourth contact, wherein the fifth contact is arranged to diagonally traverse a quadrangle defined by the first to fourth contacts.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Figure 1:
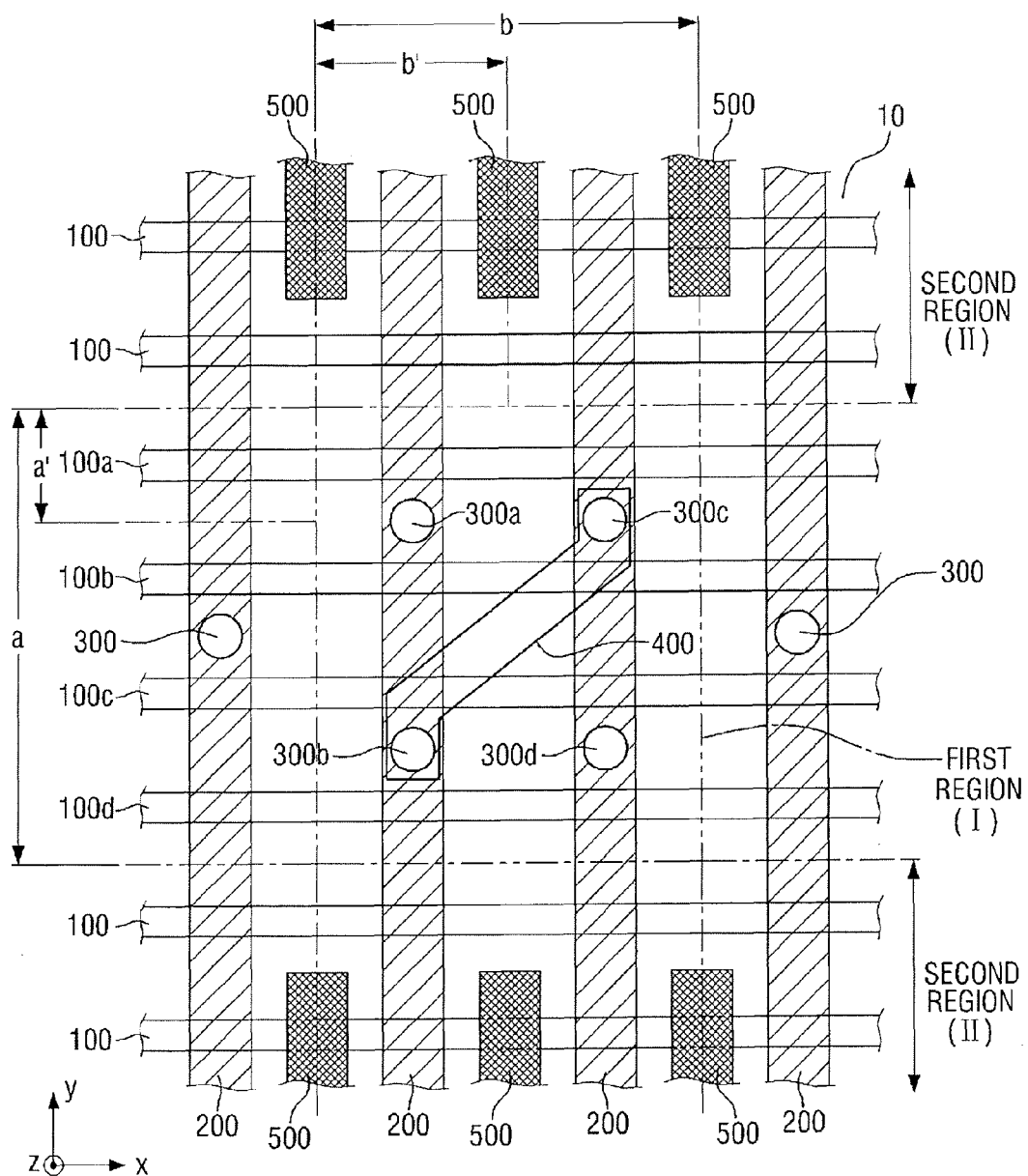
FIG. 1 is a layout diagram for a semiconductor device according to an embodiment of the present inventive concept.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Like reference numerals may refer to like elements throughout the specification and drawings.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein. A semiconductor device according to an embodiment of the present inventive concept will be described with reference to FIGS. 1 to 4.

Figure 2:
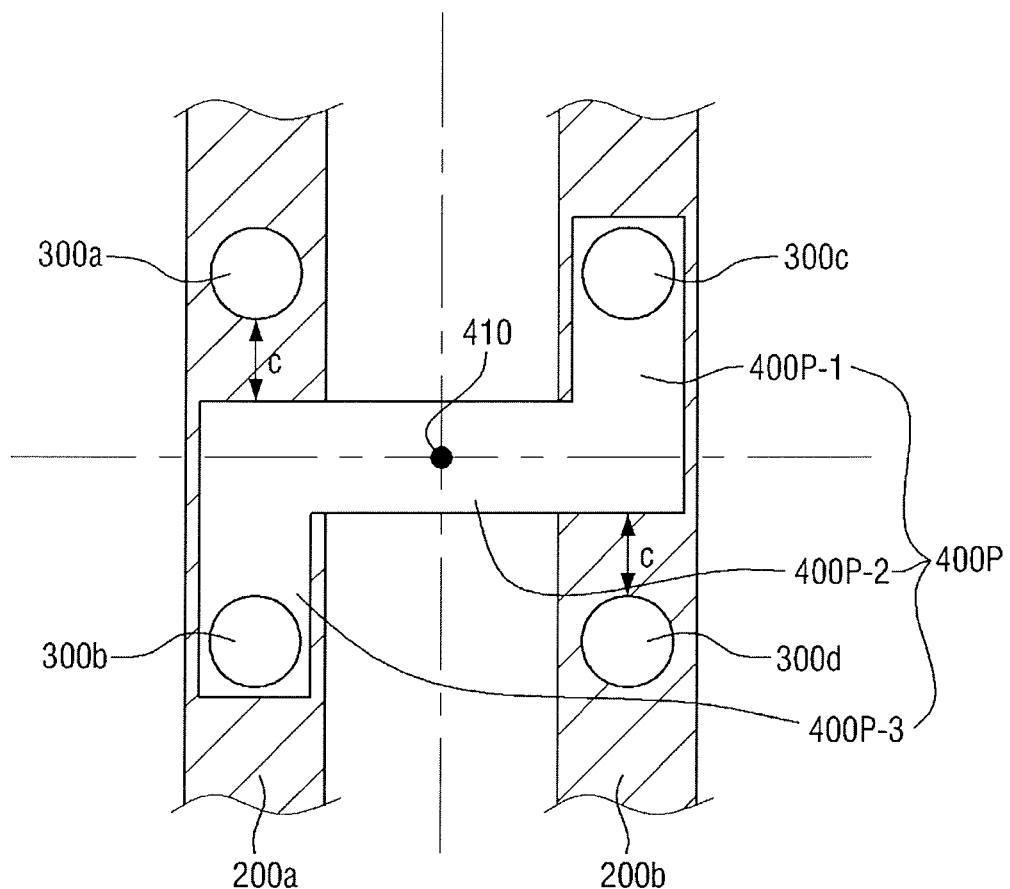
FIG. 2 is a layout diagram for a first region of FIG. 1 in detail according to a conventional technique.
Figure 3:
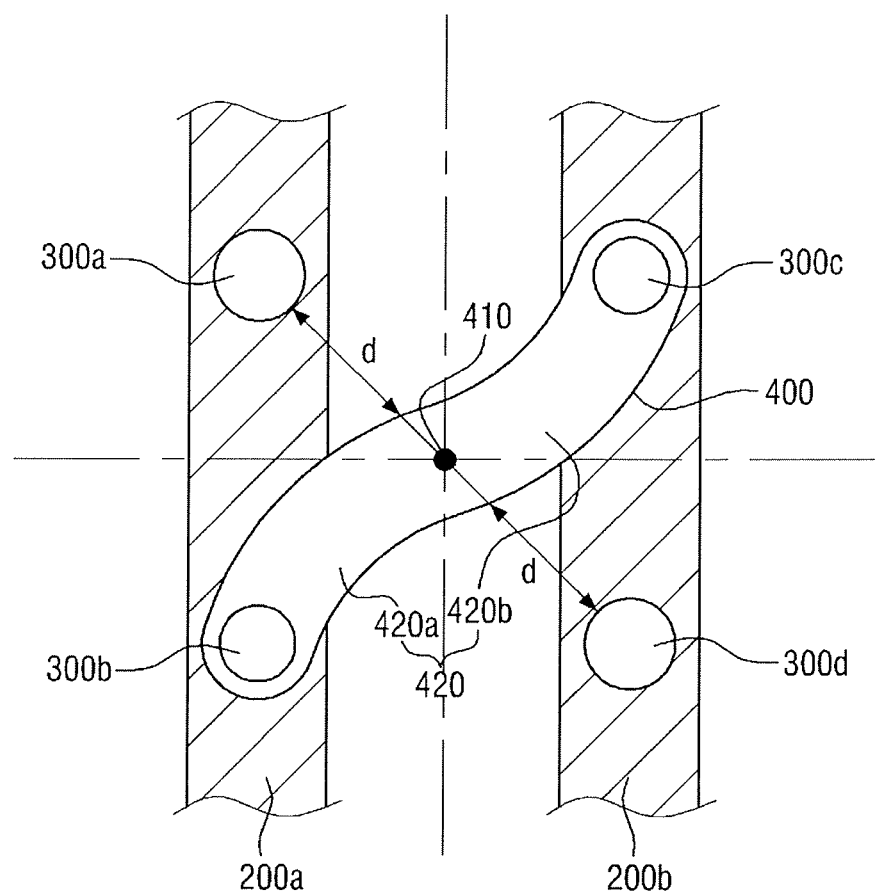
FIG. 3 is a layout diagram for a first region of FIG. 1 in detail according to an embodiment of the present inventive concept.
Figure 4:
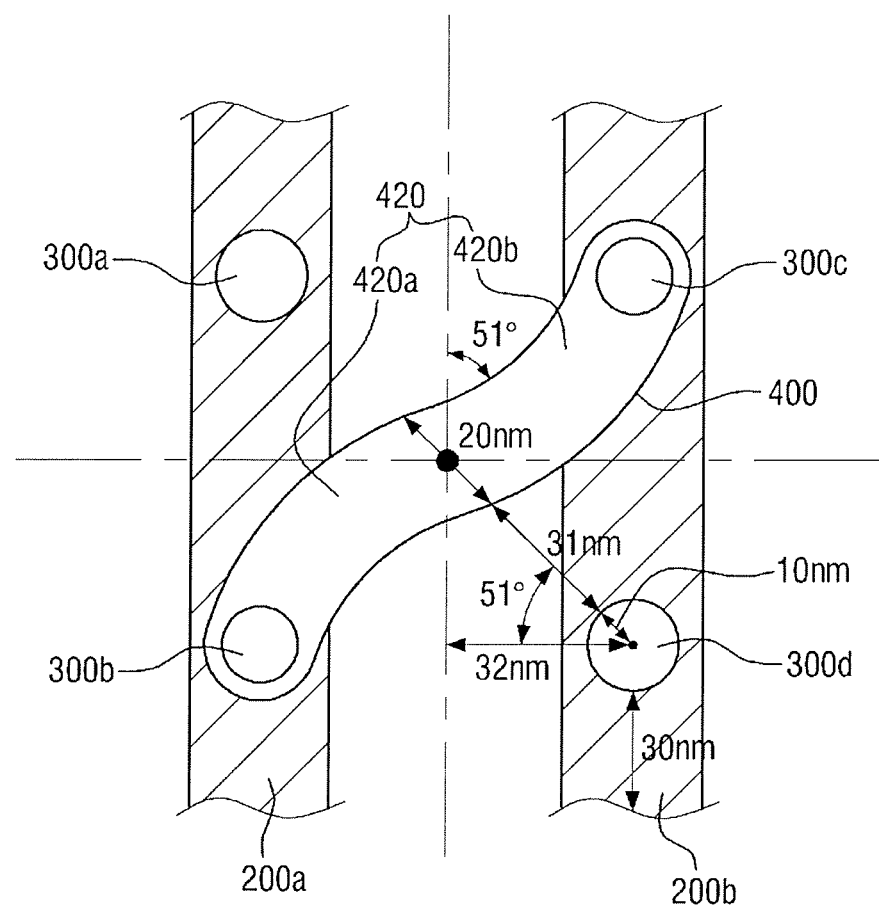
FIG. 4 is an exemplary diagram numerically illustrating the layout of FIG. 3.

FIG. 1 is a layout diagram for a semiconductor device according to an embodiment of the present inventive concept. FIG. 2 is a layout diagram for a first region of FIG. 1 in detail according to a conventional technique. FIG. 3 is a layout diagram for a first region of FIG. 1 in detail according to an embodiment of the present inventive concept. FIG. 4 is an exemplary diagram numerically illustrating the layout of FIG. 3.

Referring to FIG. 1, a semiconductor device according to an embodiment of the present inventive concept includes a substrate 10, a fin 100, a gate line 200, first to fourth contacts 300a, 300b, 300c and 300d, a fifth contact 400, a sixth contact 500, and the like.

In an embodiment, the substrate 10 may be a rigid substrate such as a silicon substrate, a silicon on insulator (SOI) substrate, a gallium arsenide substrate, a silicon germanium substrate, a ceramic substrate, a quartz substrate, and a glass substrate for a display, or a flexible plastic substrate including, for example, polyimide, polyether, polycarbonate, polyethersulfone, polymethylmethacrylate, polyethylene naphthalate or polyethyleneterephthalate.

The fin 100 may be formed to extend in a first direction X. The fin 100 may include a plurality of fins. The fins 100 may be arranged to be spaced apart from each other in a second direction Y intersecting the first direction X. The fins 100 may be spaced apart from each other at regular intervals. The sum of the interval and the width of the fin 100 is defined as a fin pitch a'.

The fins 100 may include first to fourth fins 100a, 100b, 100c and 100d. The first to fourth fins 100a, 100b, 100c and 100d may be formed to be adjacent to each other. The first to fourth fins 100a, 100b, 100c and 100d may be arranged sequentially in the second direction Y. For example, as illustrated, the first fin 100a may be adjacent to the second fin 100b, and the fourth fin 100d may be adjacent to the third fin 100c. The second fin 100b may be adjacent to the first fin 100a and the third fin 100c, and the third fin 100c may be adjacent to the second fin 100b and the fourth fin 100d.

The fins 100 may be part of the substrate 10, and may include an epitaxial layer grown from the substrate 10. The fins 100 may include, for example, Si, SiGe or the like.

The gate line 200 may be formed on the fins 100. The gate line 200 may be formed to extend in the second direction Y. The gate line 200 may include a plurality of gate lines. The gate lines 200 may be arranged to be spaced apart from each other in the first direction X. The gate lines 200 may be spaced apart from each other at regular intervals. The sum of the interval and the width of the gate line 200 is defined as a gate line pitch b'.

The gate lines 200 may include first and second gate lines 200a and 200b. The first and second gate lines 200a and 200b may be formed to be adjacent to each other.

The gate lines 200 may include a conductive material. The gate lines 200 may include, for example, metal, polysilicon or the like, but exemplary embodiments of the present inventive concept are not limited thereto.

A first region I including the first to fourth fins 100a, 100b, 100c and 100d and the first and second gate lines 200a and 200b may be defined. The first region I may have a length a of the second direction including four fin pitches a' of the first to fourth fins 100a, 100b, 100c and 100d, and a length b of the first direction including two gate line pitches b' of the first and second gate lines 200a and 200b. A second region II may include the gate lines 200 including the first and second gate lines 200a and 200b and the fins 100 except the first to fourth fins 100a, 100b, 100c and 100d.

Gate contacts 300 may be formed on the gate lines 200. The gate contact 300 may be formed between the fins 100. The gate contact 300 may be formed to extend in a third direction. In FIG. 1, the gate contact 300 has been illustrated to have a circular shape, but it is not limited thereto. The shape and size of the gate contact 300 are not restricted. The gate contact 300 may overlap with the gate line 200. The diameter of the gate contact 300 may be larger than the width of the gate line 200. The diameter of the gate contact 300 is smaller than the width of the gate line 200, but the gate contact 300 may have a portion which does not overlap with the gate line 200.

The gate contacts 300 may be electrically connected to the gate lines 200. The gate contacts 300 may include a conductive material. For example, the gate contacts 300 may include at least one of metal and polysilicon.

The first contact 300a may be formed between the first fin 100a and the second fin 100b. The first contact 300a may be formed on the first gate line 200a. The first contact 300a may be formed to extend in a third direction Z. The second contact 300b may be formed between the third fin 100c and the fourth fin 100d. The second contact 300b may be formed on the first gate line 200a. The second contact 300b may be formed to extend in the third direction Z.

The third contact 300c may be formed between the first fin 100a and the second fin 100b. The third contact 300c may be formed on the second gate line 200b. The third contact 300c may be formed to extend in the third direction Z. The fourth contact 300d may be formed between the third fin 100c and the fourth fin 100d. The fourth contact 300d may be formed on the second gate line 200b. The fourth contact 300d may be formed to extend in the third direction Z.

The first contact 300a and the second contact 300b may be electrically connected to the first gate line 200a. The third contact 300c and the fourth contact 300d may be electrically connected to the second gate line 200b. The first to fourth contacts 300a, 300b, 300c and 300d may include a conductive material. For example, the first to fourth contacts 300a, 300b, 300c and 300d may include at least one of metal and polysilicon.

The first to fourth contacts 300a, 300b, 300c and 300d may be electrically connected to the gate lines 200, and may be selectively connected by an interconnection structure including metal lines and vias. Accordingly, the semiconductor device according to an embodiment of the present inventive concept may function as one logic cell.

The fifth contact 400 may be formed in the first region I. The fifth contact 400 may be formed on the first to fourth contacts 300a, 300b, 300c and 300d. The fifth contact 400 may overlap the second contact 300b and the third contact 300c. The fifth contact 400 need not overlap the first contact 300a and the fourth contact 300d. The fifth contact 400 may be electrically connected to the second contact 300b and the third contact 300c which overlap with the fifth contact 400. The fifth contact 400 need not be electrically connected to the first contact 300a and the fourth contact 300d which do not overlap with the fifth contact 400.

The fifth contact 400 may be arranged to diagonally traverse a quadrangle defined by the first to fourth contacts 300a, 300b, 300c and 300d. The quadrangle may be a rectangle, square, rhombus, or trapezoid without being limited thereto.

The fifth contact 400 may have a shape to diagonally traverse the quadrangle as described above. Accordingly, it may have a maximum margin in the ground rules. That is, while connecting the fifth contact 400 to the second contact 300b and the third contact 300c, it is possible to minimize a possibility that a short circuit occurs between the fifth contact 400 and the first contact 300a and between the fifth contact 400 and the fourth contact 300d. That is, it is possible to maximize a distance between the fifth contact 400 and the first contact 300a or the fourth contact 300d.

The sixth contact 500 may be formed in the second region II. The sixth contact 500 may be formed between the gate lines 200. The sixth contact 500 may be electrically connected to source/drain regions of a fin-shaped field effect transistor (fin-FET). In FIG. 1, the sixth contact 500 is formed on one fin, but it is not limited thereto.

A conventional technique using a right angled pattern rather than a diagonal shape will be described with reference to FIG. 2. A semiconductor device according to the conventional technique includes the first and second gate lines 200a and 200b, and the first to fourth contacts 300a, 300b, 300c and 300d in the same manner as the embodiment of the present inventive concept, and further includes a right angled pattern 400p connecting the second contact 300b to the third contact 300c.

The right angled pattern 400p includes a first part 400p-1, a second part 400p-2, and a third part 400p-3. The right angled pattern 400p may be configured such that the first part 400p-1 and the second part 400p-2 are connected perpendicularly to each other, and the second part 400p-2 and the third part 400p-3 are connected perpendicularly to each other.

The first part 400p-1 may overlap the second contact 300b. The right angled pattern 400p may be electrically connected to the second contact 300b through the first part 400p-1. The third part 400p-3 may overlap the third contact 300c. The right angled pattern 400p may be electrically connected to the third contact 300c through the third part 400p-3.

The second part 400p-2 may connect the first part 400p-1 to the third part 400p-3. The second part 400p-2 may pass through a point 410 of symmetry. The point 410 of symmetry may pass through a point of symmetry of a quadrangle defined by the first to fourth contacts 300a, 300b, 300c and 300d.

The right angled pattern 400p may be spaced apart from the first contact 300a and the fourth contact 300d which do not overlap the right angled pattern 400p in order to prevent an undesired short circuit while connecting the second contact 300b and the third contact 300c which overlap with the right angled pattern 400p. However, a distance c between the right angled pattern 400p and the first contact 300a and between the right angled pattern 400p and the fourth contact 300d may be relatively small. Thus, a short circuit between the right angled pattern 400p and the first contact 300a or the fourth contact 300d may occur due to misalignment or incomplete etching in the process. Therefore, measures for preventing the short circuit may be desired.

The semiconductor device according to an embodiment of the present inventive concept will be described with reference to FIG. 3. In a semiconductor device according to an embodiment of the present inventive concept, the fifth contact 400 having a diagonal shape is formed.

The fifth contact 400 may overlap the second contact 300b and the third contact 300c. The fifth contact 400 may electrically connect the second contact 300b to the third contact 300c. The fifth contact 400 is intended to connect the second contact 300b to the third contact 300c in advance since it is difficult to perform an interconnection process later.

The fifth contact 400 passes through the point 410 of symmetry. The point 410 of symmetry is a point at which a line connecting the first contact 300a to the fourth contact 300d intersects a line connecting the second contact 300b to the third contact 300c. In other words, the point 410 of symmetry is the center of symmetry of the quadrangle defined by the first to fourth contacts 300a, 300b, 300c and 300d. The fifth contact 400 may be arranged to pass through the point 410 of symmetry such that the distance from the first contact 300a and the fourth contact 300d has a maximum value.

Patterning may be performed such that a short circuit does not occur in consideration of an overlay term or the like for securing a margin against incorrect pattern formation, line edge roughness (LER) of patterns and non-uniformity of critical dimensions. Therefore, in a semiconductor device according to an embodiment of the present inventive concept, as described above, by maximizing the distance between the first contact 300a and fifth contact 400 and between the fourth contact 300d and the fifth contact 400, it is possible to increase the reliability of the semiconductor device.

The fifth contact 400 may have a linear shape, but may have a shape including at least one bent portion 420. In an embodiment, the fifth contact 400 may include a first contact region 420a connecting the point 410 of symmetry to the second contact 300b, and a second contact region 420b connecting the point 410 of symmetry to the third contact 300c.

The first contact region 420a may have a convex shape in a direction away from the fourth contact 300d. Accordingly, the shortest distance between the first contact region 420a and the fourth contact 300d becomes a distance d between the point 410 of symmetry and the fourth contact 300d. This is because the distance between the first contact region 420a and the fourth contact 300d increases due to the convex shape of the first contact region 420a.

The second contact region 420b may have a convex shape in a direction away from the first contact 300a. Accordingly, the shortest distance between the second contact region 420b and the first contact 300a becomes a distance d between the point 410 of symmetry and the first contact 300a. This is because the distance between the second contact region 420b and the first contact 300a increases due to the convex shape of the second contact region 420b.

Thus, the shortest distance between the first contact 300a and fifth contact 400 and between the fourth contact 300d and the fifth contact 400 becomes the distance d between the fifth contact 400 of the point 410 of symmetry and the first contact 300a and between the fifth contact 400 of the point 410 of symmetry and the fourth contact 300d. The distance d is larger than the distance c between the right angled pattern 400p of FIG. 2 and each of the first contact 300a and the fourth contact 300d. That is, in a semiconductor device according to an embodiment of the present inventive concept, the distance between the fifth contact 400 and each of the first contact 300a and the fourth contact 300d which do not overlap with the fifth contact 400 may further increase.

Referring to FIG. 4, an exemplary slope of the fifth contact 400 according to the design rules may be derived. For example, the gate line pitch b' may be 64 nm, and the gate contacts 300 including the first to fourth contacts 300a, 300b, 300c and 300d may have a circular shape with a radius of 10 nm. Further, the fifth contact 400 may have a constant width of 20 nm. Further, the fin pitch a' may be set to 42 nm. When applying the above design rules, the length a of the second direction Y of the first region I to which the four fins 100 belong may be 42×4=168 nm. Further, the length b of the first direction X of the first region I to which the two gate lines 200 belong may be 64×2=128 nm. A distance from the corner of the first region I to each of the first to fourth contacts 300a, 300b, 300c and 300d may be set to 30 nm.

As shown in FIG. 4, the distance between the point 410 of symmetry and the fourth contact 300d may be 10 nm+31 nm+10 nm=51 nm in consideration of a half of the width of the fifth contact 400 and the radius of the fourth contact 300d. Further, since a half of the gate line pitch b' is 32 nm, according to the Pythagorean theorem, a distance between the point 410 of symmetry and a line connecting the second contact 300b to the fourth contact 300d may be approximately 40 nm. When considering the radius (10 nm) of the fourth contact 300d and the distance (30 nm) between the corner of the first region I and the fourth contact 300d, the distance from the point 410 of symmetry to the corner of the first region I becomes approximately 40+10+30=80 nm.

Since the distance (80 nm) is smaller than a half (168/2=84 nm) of the length a of the second direction Y of the first region I to which the four fins 100 belong, it may precisely conform to the design rules. In this case, the fifth contact 400 has a slope of 51 degrees from the second direction.

Thus, in a semiconductor device according to an embodiment of the present inventive concept, it is possible to prevent a short circuit while satisfying the design rules such that a narrow space can be effectively used, thereby increasing the reliability of semiconductor devices.

Hereinafter, a fabricating method of a semiconductor device according to an embodiment of the present inventive concept will be described with reference to FIGS. 5 to 13.

Figure 5:
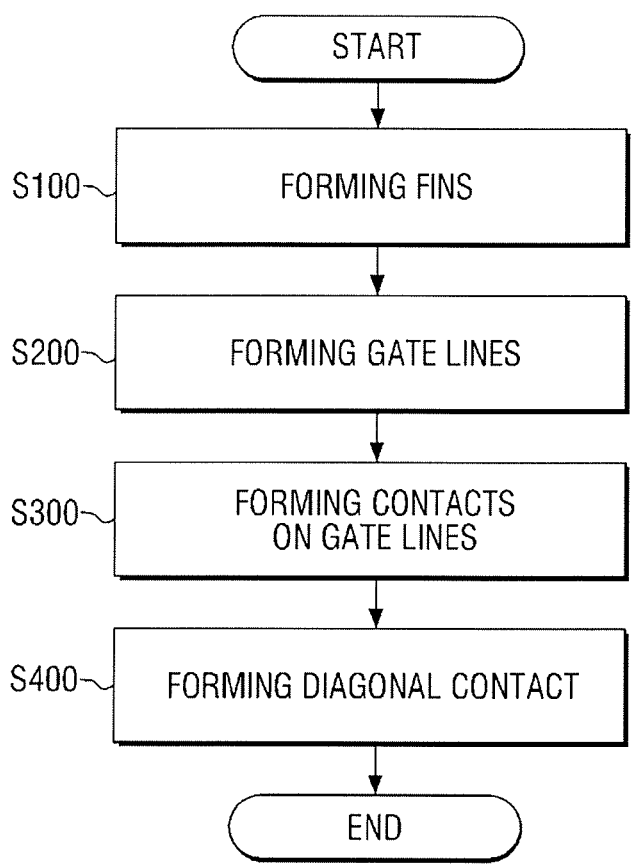
FIG. 5 is a flowchart for a fabricating method of a semiconductor device according to an embodiment of the present inventive concept.

FIG. 5 is a flowchart for a fabricating method of a semiconductor device according to an embodiment of the present inventive concept. FIGS. 6 to 13 are diagrams showing intermediate steps for a fabricating method of a semiconductor device according to an embodiment of the present inventive concept.

Figure 6:
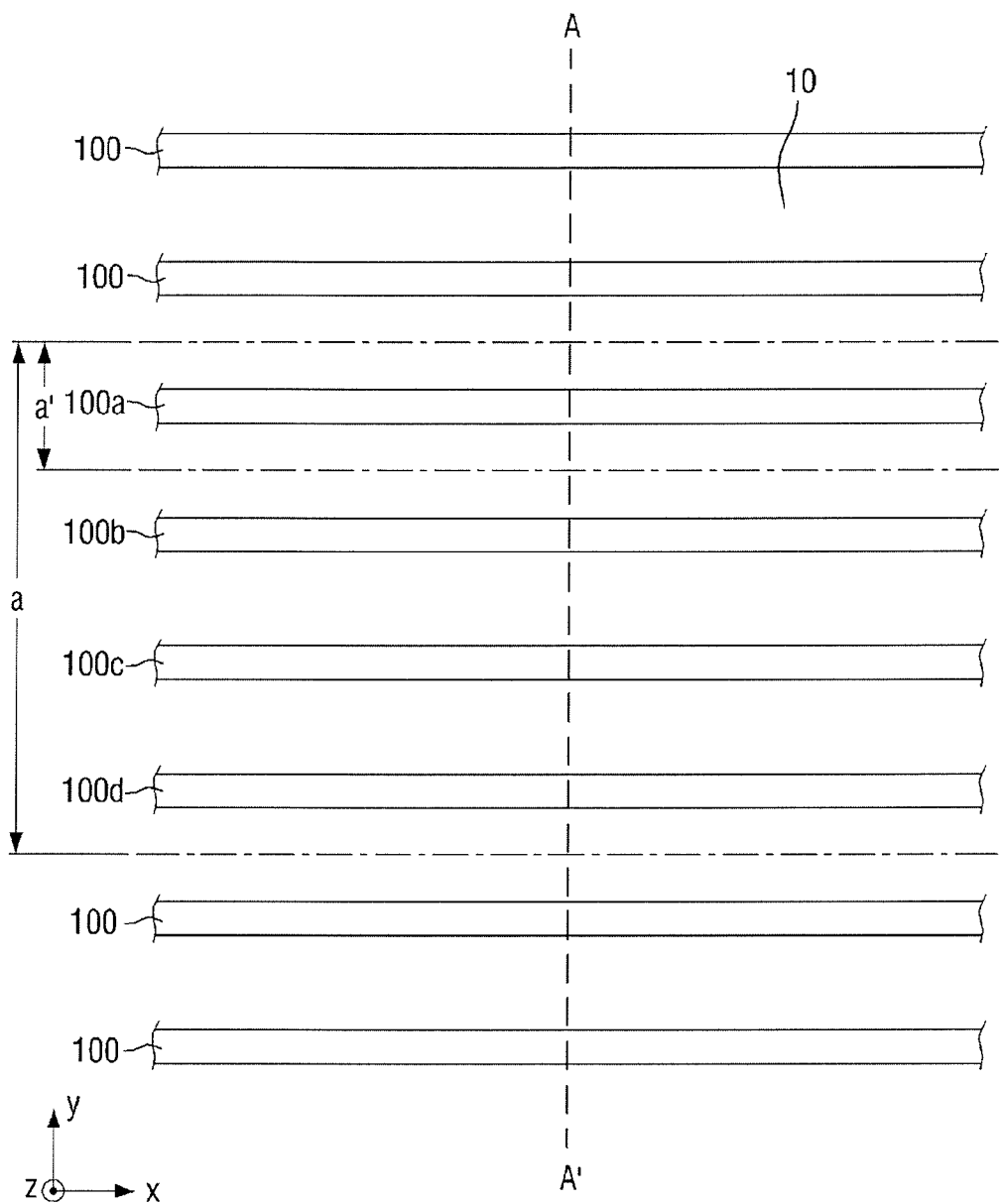
FIGS. 6 to 13 are diagrams showing a method of fabricating a semiconductor device according to an embodiment of the present inventive concept.
Figure 7:
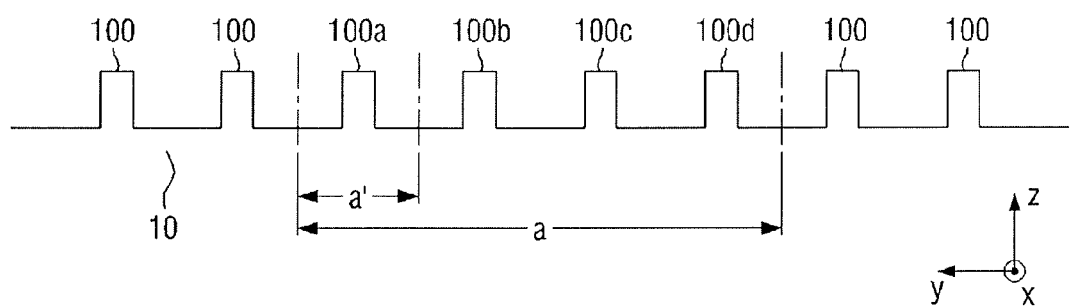

Referring to FIGS. 5 to 7, fins are formed on a substrate (step S100).

FIG. 6 is a plan view showing a state where the fins are formed on the substrate. FIG. 7 is a vertical cross-sectional view taken along line A-A' of FIG. 6 according to an embodiment of the present inventive concept.

Referring to FIG. 6, a substrate 10 may be provided. The substrate 10 may be a rigid substrate such as a silicon substrate, a silicon on insulator (SOI) substrate, a gallium arsenide substrate, a silicon germanium substrate, ceramic substrate, a quartz substrate, and a glass substrate for a display, or a flexible plastic substrate including, for example, polyimide, polyether, polycarbonate, polyethersulfone, polymethylmethacrylate, polyethylene naphthalate or polyethyleneterephthalate.

Subsequently, a fin 100 may be formed on the substrate 10 to extend in a first direction X. A plurality of fins 100 may be formed on the substrate 10. In this case, the plurality of fins 100 may be arranged to be spaced apart from each other in a second direction Y intersecting the first direction X, and the plurality of fins 100 may be arranged at regular intervals. The sum of the interval and the width of the fin 100 is defined as a fin pitch a'. The plurality of fins 100 may be formed at the same time. One fin 100 has a constant fin pitch a', and the length a corresponding to the four fin pitches a' in the second direction may be defined by first to fourth fins 100a, 100b, 100c and 100d.

The plurality of fins 100 may include the first to fourth fins 100a, 100b, 100c and 100d. In this case, the first to fourth fins 100a, 100b, 100c and 100d may be formed to be adjacent to each other. That is, the first to fourth fins 100a, 100b, 100c and 100d may be arranged sequentially in the second direction Y. For example, as illustrated, the first fin 100a may be adjacent to the second fin 100b, and the fourth fin 100d may be adjacent to the third fin 100c. The second fin 100b may be adjacent to the first fin 100a and the third fin 100c, and the third fin 100c may be adjacent to the second fin 100b and the fourth fin 100d.

The fins 100 may be part of the substrate 10, and may include an epitaxial layer grown from the substrate 10. The fins 100 may include, for example, Si, SiGe or the like. That is, the substrate 10 on which the fins 100 are formed may also be provided.

Referring again to FIGS. 1, 5, 8 and 9, gate lines are formed on the fins (step S200).

Figure 8:
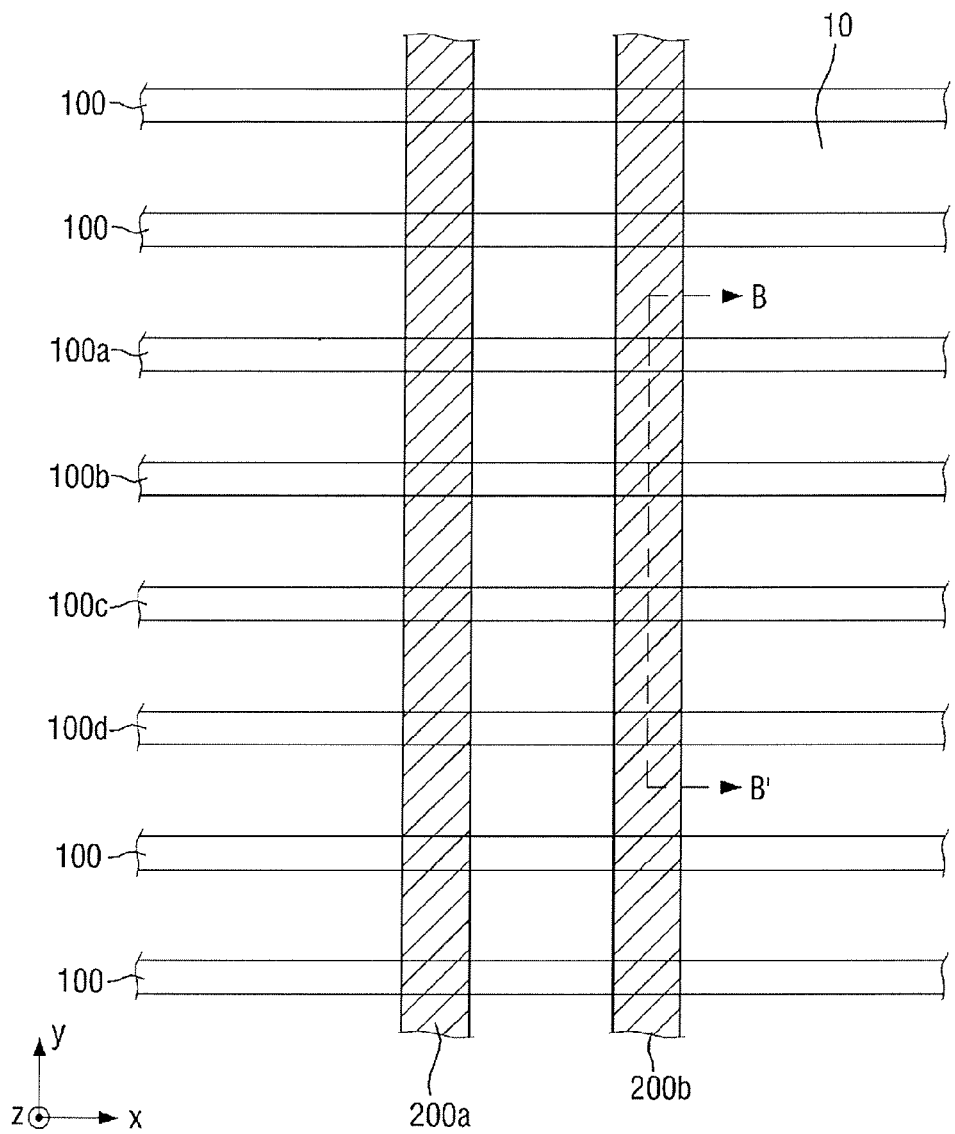
Figure 9:
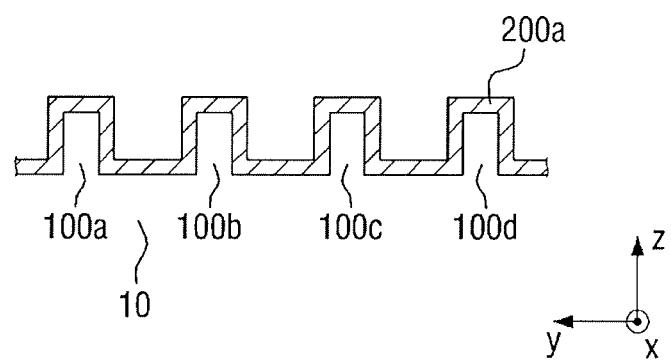

FIG. 8 is a plan view showing a state where the gate lines are formed on the fins. FIG. 9 is a vertical cross-sectional view taken along line B-B' of FIG. 8 according to an embodiment.

Referring to FIG. 8, a gate line 200 may be formed on the fins 100. In this case, the gate line 200 may be formed to extend in the second direction Y. The gate line 200 may include a plurality of gate lines. The gate lines 200 may be arranged to be spaced apart from each other in the first direction X. In this case, the gate lines 200 may be spaced apart from each other at regular intervals. The sum of the interval and the width of the gate line 200 is defined as a gate line pitch b'.

The gate lines 200 may include first and second gate lines 200a and 200b. The first and second gate lines 200a and 200b may be formed to be adjacent to each other.

The gate lines 200 may include a conductive material. The gate lines 200 may include, for example, metal, polysilicon or the like, but exemplary embodiments of the present inventive concept are not limited thereto.

Referring again to FIG. 1, a first region I including the first to fourth fins 100a, 100b, 100c and 100d and the first and second gate lines 200a and 200b may be defined. The first region I may have a length a of the second direction including four fin pitches a' of the first to fourth fins 100a, 100b, 100c and 100d, and a length b of the first direction including two gate line pitches b' of the first and second gate lines 200a and 200b. A second region II may include the gate lines 200 including the first and second gate lines 200a and 200b and the fins 100 except the first to fourth fins 100a, 100b, 100c and 100d.

Referring to FIG. 9, the first to fourth fins 100a, 100b, 100c and 100d are formed on the substrate 10, and the second gate line 200b is formed thereon. The second gate line 200b may be formed on the substrate 10 and the first to fourth fins 100a, 100b, 100c and 100d to have a predetermined height in a third direction Z.

Referring again to FIGS. 5, 10 and 11, contacts are formed on the gate lines (step S300).

Figure 10:
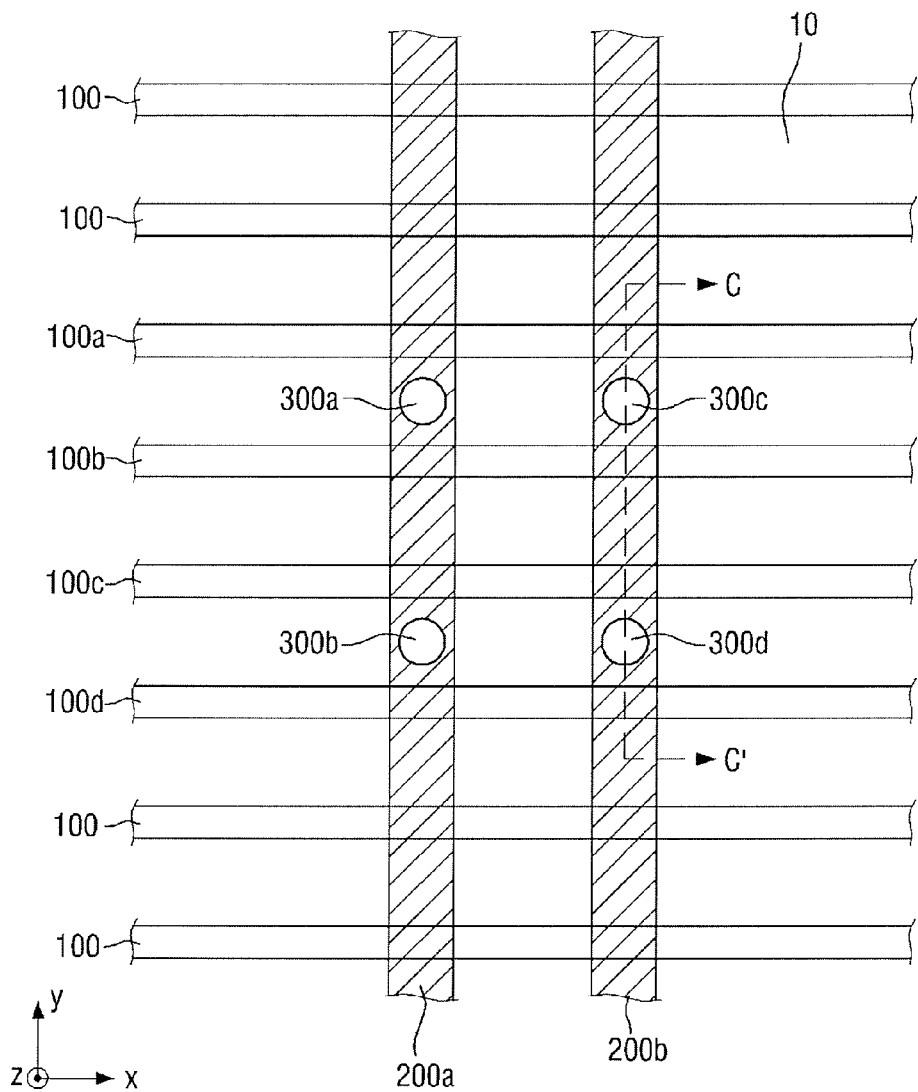
Figure 11:
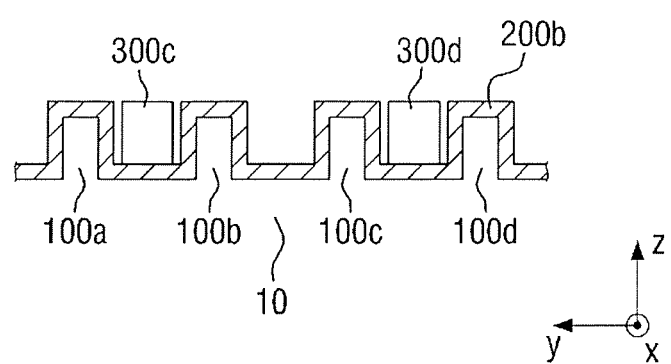

FIG. 10 is a plan view showing a state where the contacts are formed on the gate lines. FIG. 11 is a vertical cross-sectional view taken along line C-C' of FIG. 10 according to an embodiment.

Referring to FIGS. 10 and 11, the first contact 300a may be formed between the first fin 100a and the second fin 100b. In this case, the first contact 300a may be formed on the first gate line 200a. The first contact 300a may be formed to extend in the third direction Z. The second contact 300b may be formed between the third fin 100c and the fourth fin 100d. In this case, the second contact 300b may be formed on the first gate line 200a. The second contact 300b may be formed to extend in the third direction Z.

The third contact 300c may be formed between the first fin 100a and the second fin 100b. The third contact 300c may be formed on the second gate line 200b. The third contact 300c may be formed to extend in the third direction Z. The fourth contact 300d may be formed between the third fin 100c and the fourth fin 100d. The fourth contact 300d may be formed on the second gate line 200b. The fourth contact 300d may be formed to extend in the third direction Z.

The first contact 300a and the second contact 300b may be electrically connected to the first gate line 200a. The third contact 300c and the fourth contact 300d may be electrically connected to the second gate line 200b. The first to fourth contacts 300a, 300b, 300c and 300d may include a conductive material. For example, the first to fourth contacts 300a, 300b, 300c and 300d may include at least one of metal and polysilicon.

The first to fourth contacts 300a, 300b, 300c and 300d may be formed at the same time. This is because the first to fourth contacts 300a, 300b, 300c and 300d are formed on the same level and it is economical to form the first to fourth contacts 300a, 300b, 300c and 300d at a time by using one mask.

The first to fourth contacts 300a, 300b, 300c and 300d may be electrically connected to the gate lines 200, and may be selectively connected by an interconnection structure including metal lines and vias. Accordingly, a semiconductor device according to an embodiment of the present inventive concept may function as one logic cell.

Referring again to FIGS. 2, 5, 12 and 13, a diagonal contact is formed (step S400).

Figure 12:
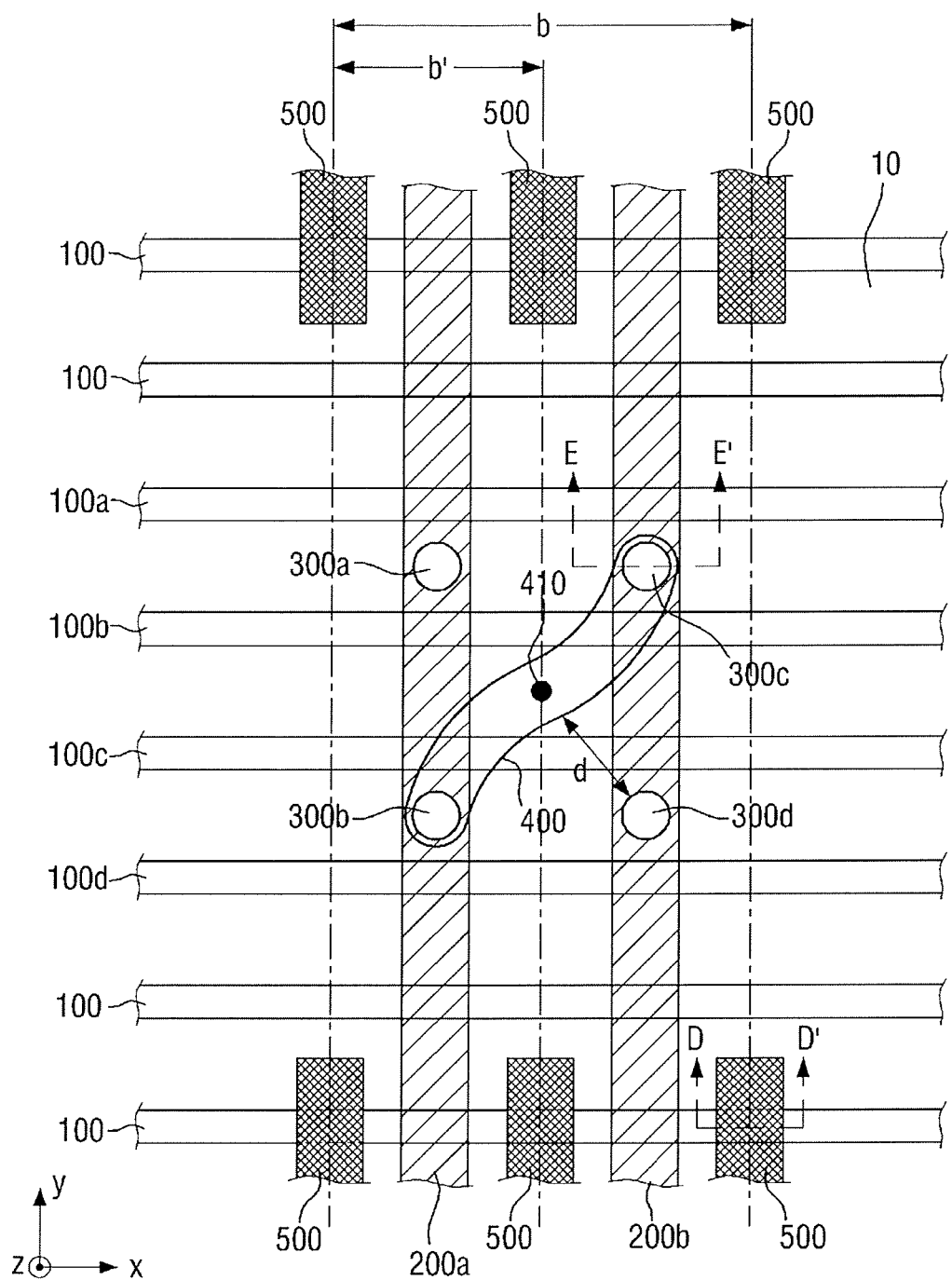
Figure 13:
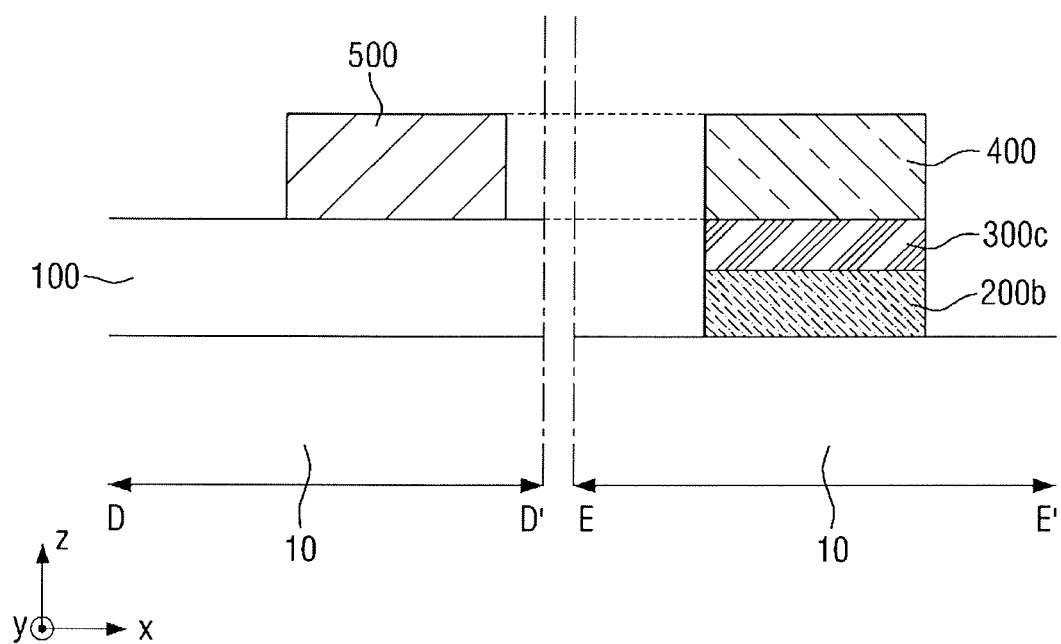

FIG. 12 is a plan view showing a state where a fifth contact is formed. FIG. 13 is a vertical cross-sectional view taken along lines D-D' and E-E' of FIG. 12 according to an embodiment.

Referring to FIG. 12, a fifth contact 400 may be formed in the first region I. The fifth contact 400 may be formed on the first to fourth contacts 300a, 300b, 300c and 300d. The fifth contact 400 may overlap the second contact 300b and the third contact 300c. The fifth contact 400 need not overlap the first contact 300a and the fourth contact 300d. The fifth contact 400 may be electrically connected to the second contact 300b and the third contact 300c which overlap with the fifth contact 400. The fifth contact 400 need not be electrically connected to the first contact 300a and the fourth contact 300d which do not overlap with the fifth contact 400.

The fifth contact 400 may be arranged to diagonally traverse a quadrangle defined by the first to fourth contacts 300a, 300b, 300c and 300d. The quadrangle may be a rectangle, square, rhombus, or trapezoid without being limited thereto.

The fifth contact 400 may have a shape to diagonally traverse the quadrangle as described above. Accordingly, it may have a maximum margin in the ground rules. That is, while connecting the fifth contact 400 to the second contact 300b and the third contact 300c, it is possible to minimize a possibility that a short circuit occurs between the fifth contact 400 and the first contact 300a and between the fifth contact 400 and the fourth contact 300d. That is, it is possible to maximize a distance between the fifth contact 400 and the first contact 300a or the fourth contact 300d.

Referring again to FIG. 2, in the case of forming the conventional right angled pattern 400p, since it is difficult to simultaneously fabricate the first part 400p-1, the second part 400p-2 and the third part 400p-3, more masks may be used, which may cause difficulty in the fabrication. On the other hand, the semiconductor device according to the embodiment of the present inventive concept may have a cost advantage because the fifth contact 400 can be fabricated by using only one mask.

Referring again to FIG. 12, the sixth contact 500 may be formed in the second region II. The sixth contact 500 may be formed between the gate lines 200. The sixth contact 500 may be electrically connected to source/drain regions of a fin-shaped field effect transistor (fin-FET). In FIG. 12, the sixth contact 500 is formed on one fin 100, but it is not limited thereto. The fifth contact 400 and the sixth contact 500 may be formed at the same time.

Referring to FIG. 13, the fifth contact 400 and the sixth contact 500 may be formed at the same time on the same level. The fifth contact 400 may be formed on the first to fourth contacts 300a, 300b, 300c and 300d, and the sixth contact 500 may be formed on the fins 100.

Hereinafter, the step S400 of forming the diagonal contact of FIG. 5 will be described in detail with reference to FIGS. 14 to 22.

Figure 14:
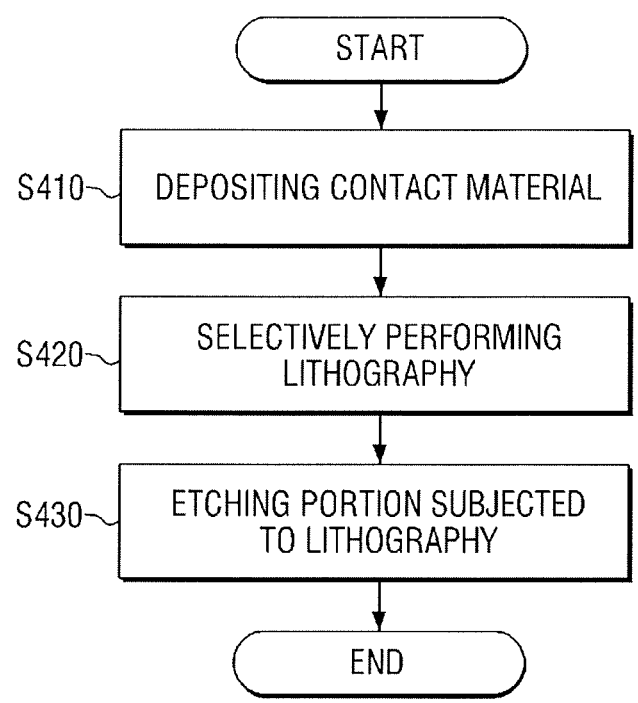
FIG. 14 is a flowchart for a step of forming a diagonal contact of FIG. 5 according to an embodiment of the inventive concept.

FIG. 14 is a flowchart for a step of forming a diagonal contact of FIG. 5 according to an embodiment.

Referring to FIG. 14, a contact material is deposited (step S410).

Since the contact material may be patterned later to become the fifth contact 400, it may be a conductive material. For example, the contact material may be metal or polysilicon. The contact material may be formed on the first to fourth contacts 300a, 300b, 300c and 300d, the first gate line 200a, the second gate line 200b and the first to fourth fins 100a, 100b, 100c and 100d of the first region I. An interlayer insulating film may be formed between the contact material and the first to fourth contacts 300a, 300b, 300c and 300d, the first gate line 200a, the second gate line 200b and the first to fourth fins 100a, 100b, 100c and 100d.

Subsequently, referring to FIGS. 12 and 14 to 22, the contact material is selectively subjected to lithography (step S420).

After a mask having a desired pattern is formed on the contact material, a portion except for the mask may be subjected to lithography. When a portion on which the mask is not formed is removed later by an etching process, only a portion covered with the mask remains. Thus, this is called positive lithography.

Therefore, to pattern a shape of the fifth contact 400 of FIG. 12, a mask having the same shape may be desired. A method of forming a mask will be described with reference to FIGS. 15 to 20.

A method of producing a mask by using a staircase pattern will be described with reference to FIG. 15.

Figure 15:
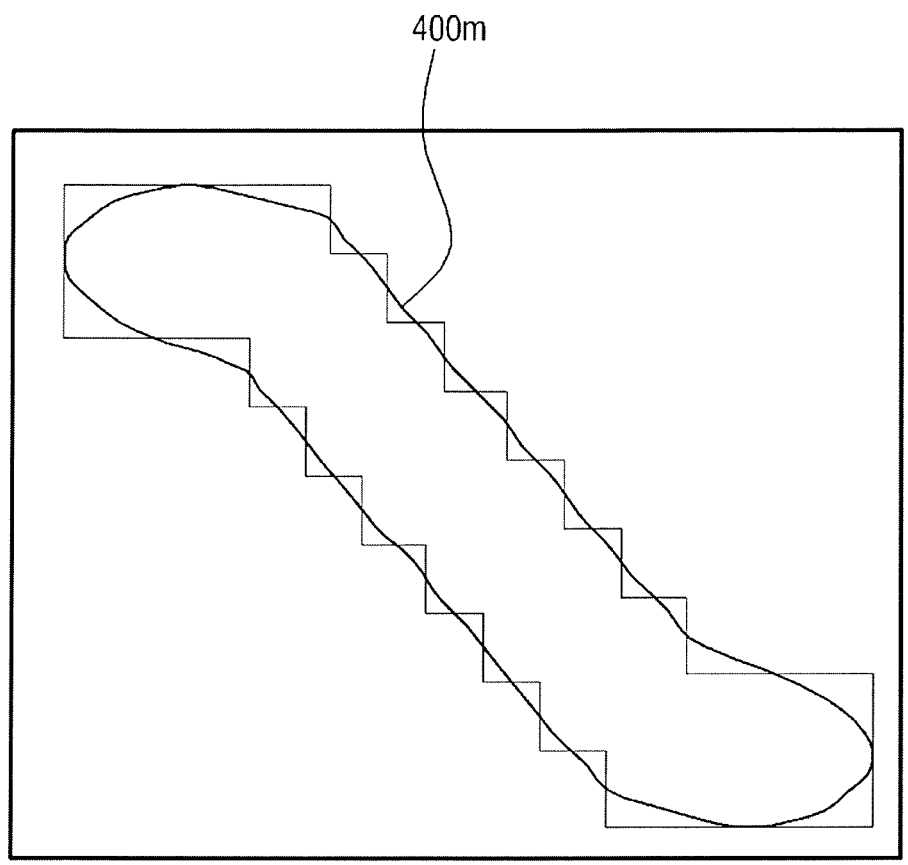
FIG. 15 is a layout diagram for a staircase pattern used in a fabricating method of a semiconductor device according to an embodiment of the present inventive concept.

FIG. 15 is a layout diagram for a staircase pattern used in fabricating a semiconductor device according to an embodiment of the present inventive concept.

Referring to FIG. 15, a mask pattern 400m of the fifth contact 400 may include a plurality of sub-mask patterns. The plurality of sub-mask patterns may be, but is not limited to, a staircase pattern. That is, the mask pattern 400m of the fifth contact 400 may be a non-staircase pattern. In the case where the mask pattern 400m of the fifth contact 400 is a staircase pattern, the fifth contact 400 may be patterned in a diagonal shape during a patterning process.

Hereinafter, a method of producing a mask by using a non-staircase pattern will be described with reference to FIGS. 16 to 20.

Figure 16:
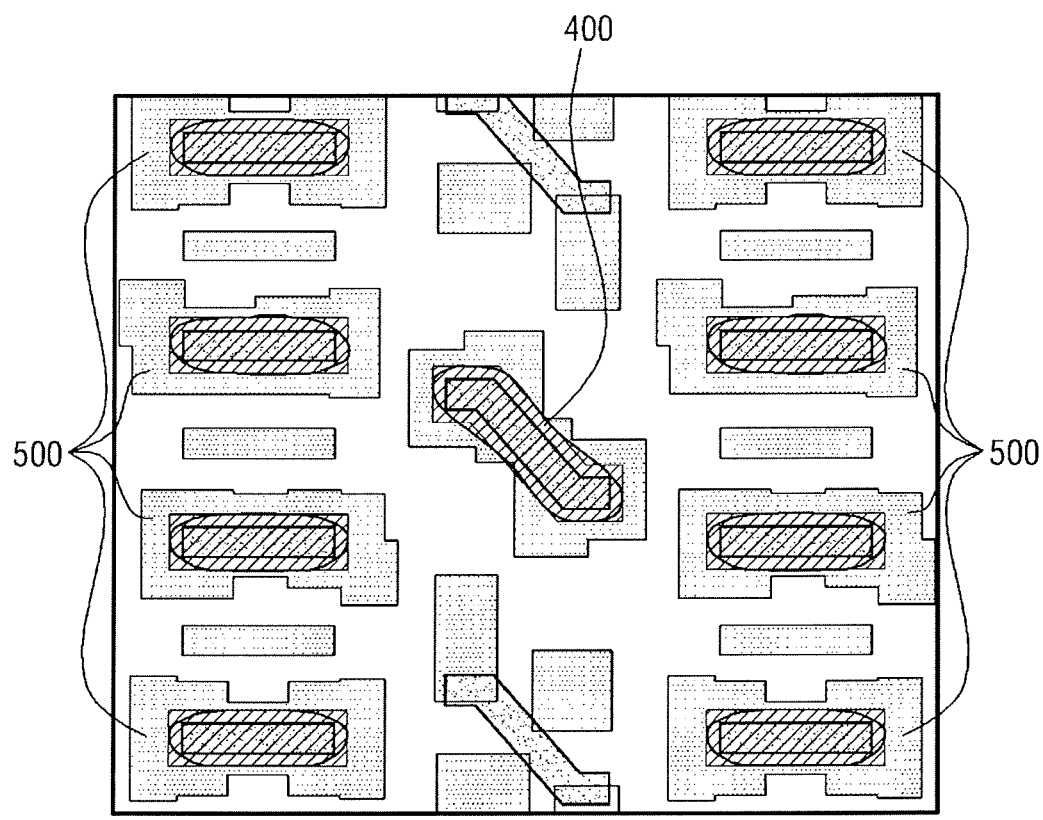
FIG. 16 is a DCD image obtained by a simulation in which the length of the pattern used in the fabricating method of the semiconductor device according to an embodiment of the present inventive concept is set to 36 nm.
Figure 17:
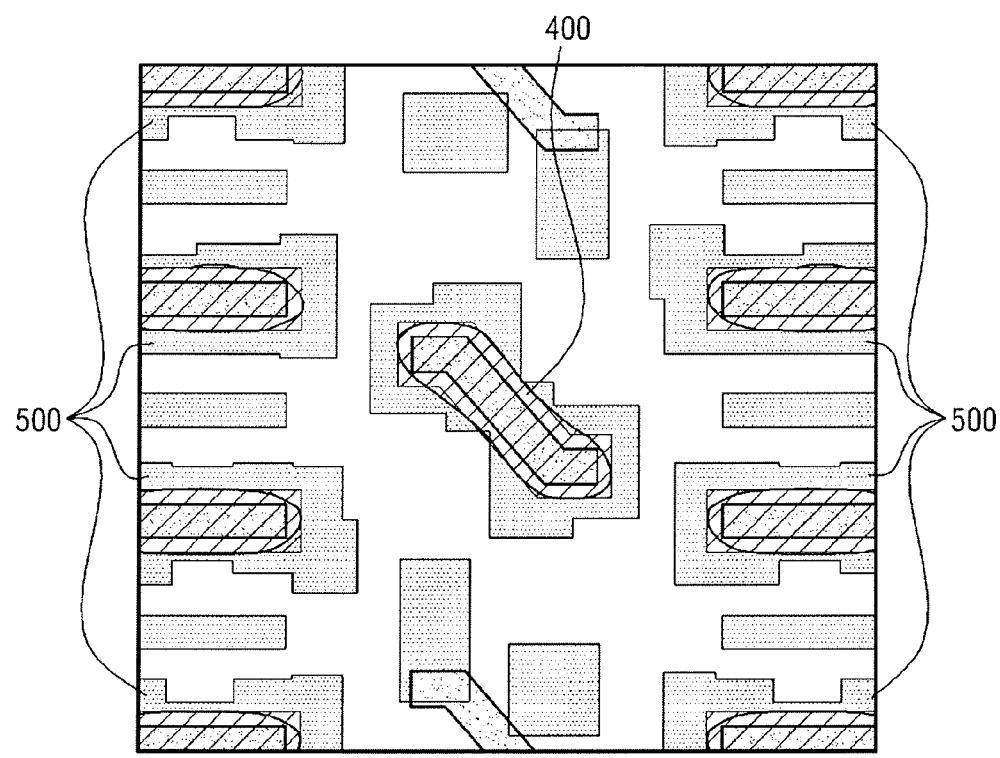
FIG. 17 is a DCD image obtained by a simulation in which the length of the pattern used in the fabricating method of the semiconductor device according to an embodiment of the present inventive concept is set to 40 nm.
Figure 18:
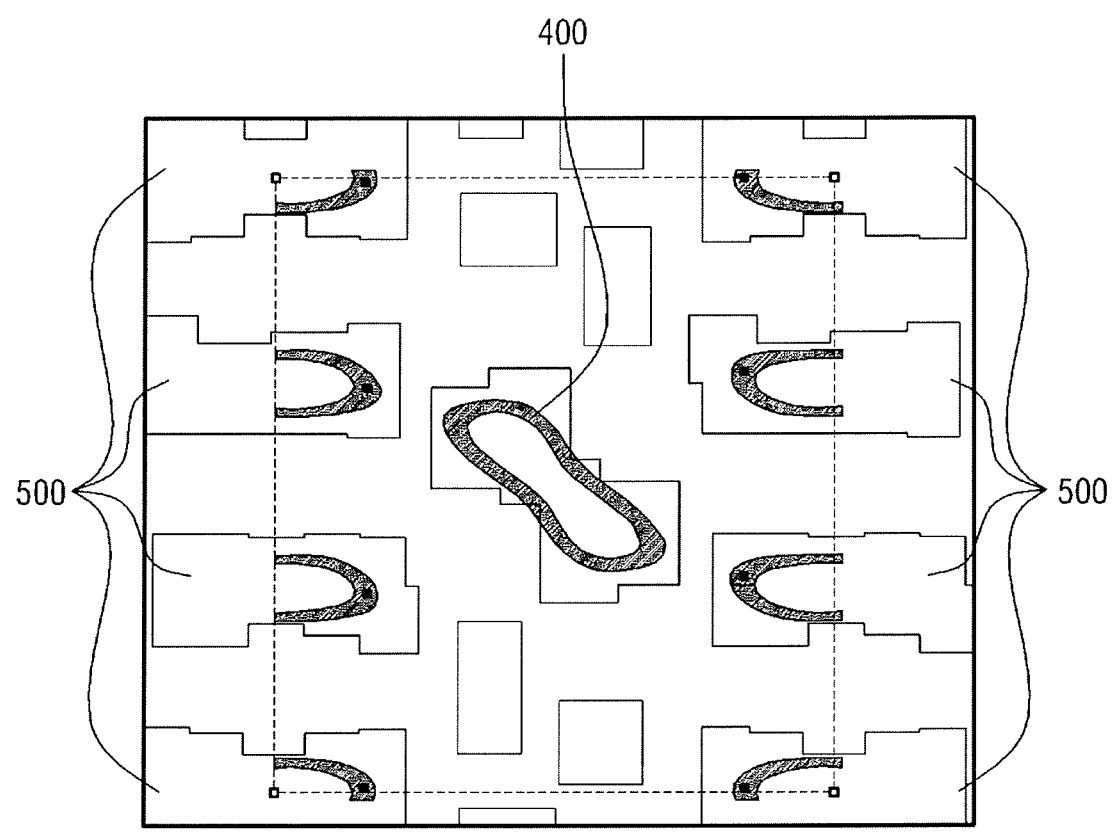
FIG. 18 is a DCD image showing a process variation (PV) band in the simulation in which the length of the pattern used in the fabricating method of the semiconductor device according to an embodiment of the present inventive concept is set to 36 nm.
Figure 19:
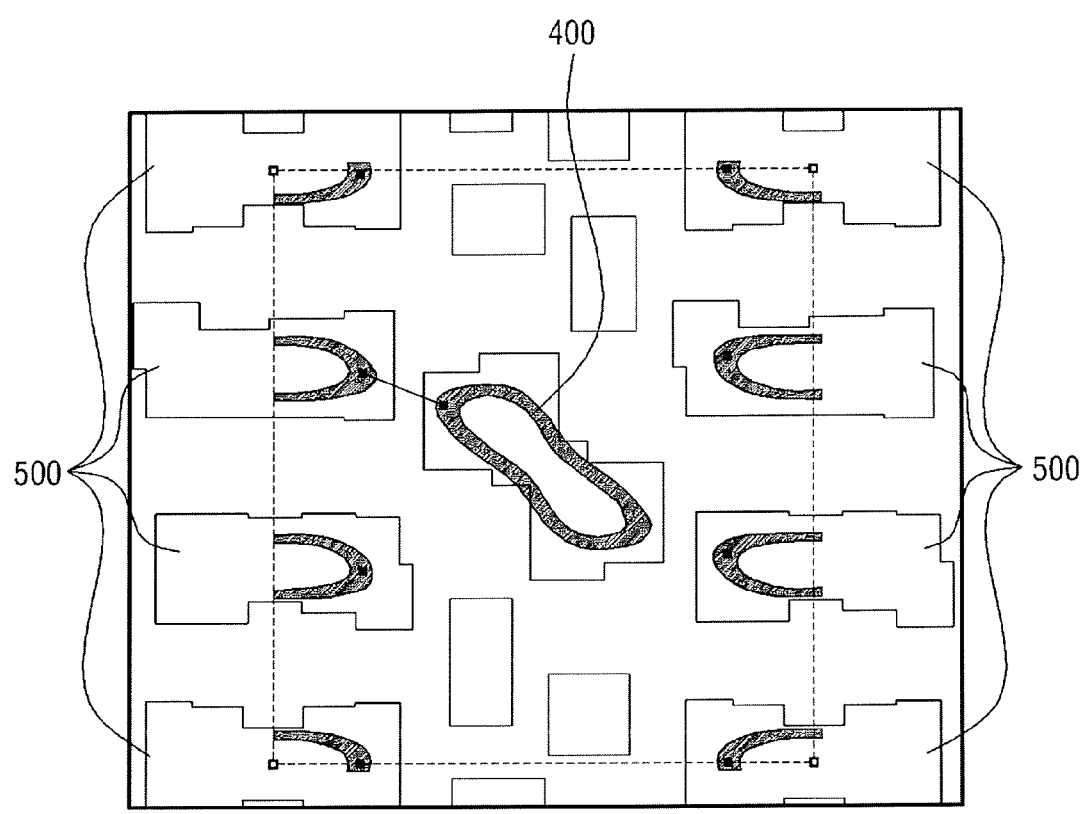
FIG. 19 is a DCD image showing a process variation (PV) band in the simulation in which the length of the pattern used in the fabricating method of the semiconductor device according to an embodiment of the present inventive concept is set to 40 nm.
Figure 20:
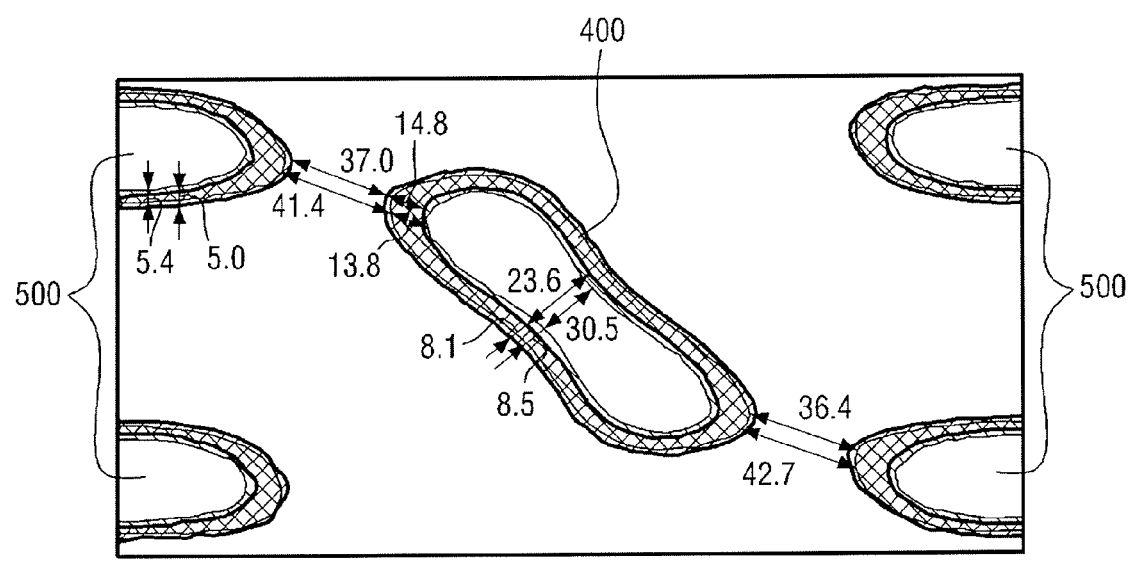
FIG. 20 is an image obtained by comparing the DCD image of FIG. 18 with the DCD image of FIG. 19.

FIG. 16 is a DCD image obtained by a simulation in which the length of the pattern used in the fabricating method of the semiconductor device according to the embodiment of the present inventive concept is set to 36 nm. FIG. 17 is a DCD image obtained by a simulation in which the length of the pattern used in the fabricating method of the semiconductor device according to the embodiment of the present inventive concept is set to 40 nm. FIG. 18 is a DCD image showing a process variation (PV) band in the simulation in which the length of the pattern used in the fabricating method of the semiconductor device according to the embodiment of the present inventive concept is set to 36 nm. FIG. 19 is a DCD image showing a process variation (PV) band in the simulation in which the length of the pattern used in the fabricating method of the semiconductor device according to the embodiment of the present inventive concept is set to 40 nm. FIG. 20 is an image obtained by comparing the DCD image of FIG. 18 with the DCD image of FIG. 19.

The DCD image is an image for critical dimensions after lithography. FIGS. 16 and 17 show the simulation results for targets in which the lengths of the diagonal lines of the fifth contact 400 are 36 nm and 40 nm, respectively. It can be seen that a diagonal shape is formed clearly in spite of using a non-staircase pattern.

The process variation (PV) band is a parameter for observing a change of the pattern due to changes in the exposure conditions of various parameters such as a focus of exposure light and exposure latitude. FIGS. 18 and 19 show the simulation results of the PV band for targets in which the lengths of the diagonal lines of the sixth contact 500 are 36 nm and 40 nm, respectively. As the width of the strip-shaped PV band is narrower, the success rate of patterning is higher. From each of FIGS. 18 and 19, a narrow PV band can be identified. Referring to FIG. 20, the PV band of the sixth contact 500 is about 5 nm, and the PV band of the fifth contact 400 is about 8 nm. It can be confirmed that the fifth contact 400 may be patterned as a diagonal shape even when the width of the fifth contact 400 is relatively large.

Hereinafter, a method of optimizing an illumination method will be described with reference to FIGS. 21 and 22.

Figure 21:
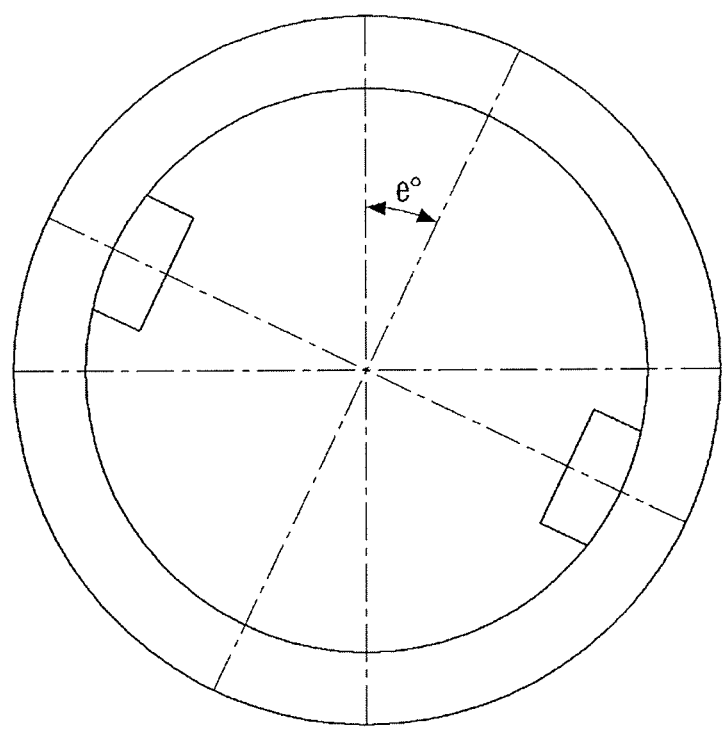
FIG. 21 is a diagram illustrating an illumination method used in the fabricating method of the semiconductor device according to an embodiment of the present inventive concept.
Figure 22:
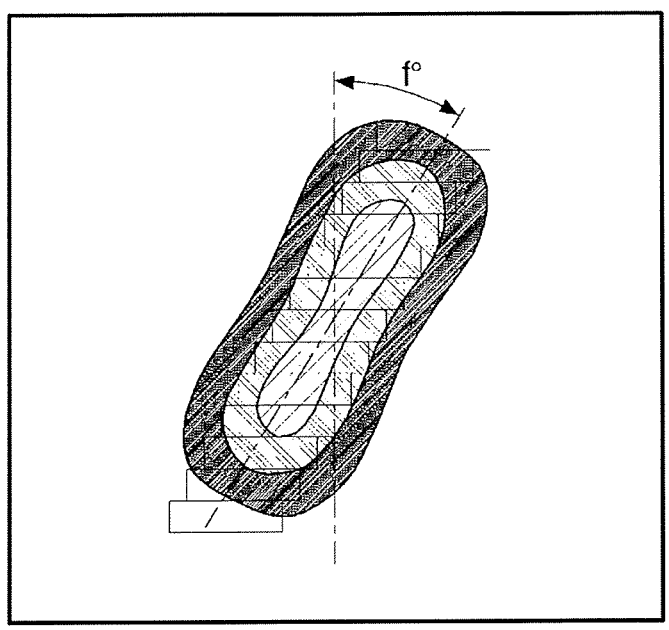
FIG. 22 is an optical simulation photograph for the fabricating method of the semiconductor device according to an embodiment of the present inventive concept.

FIG. 21 is a diagram illustrating an illumination method used in fabricating a semiconductor device according to an embodiment of the present inventive concept. FIG. 22 is an optical simulation photograph for a method of fabricating a semiconductor device according to an embodiment of the present inventive concept.

In the patterning using lithography, it is possible to increase the success rate of patterning of the fifth contact 400 having a diagonal shape by controlling the illumination of the fifth contact 400 by adjusting the shape, focus and light quantity of exposure light while performing the optimization of the mask pattern.

The illumination method may adjust the shape, focus and dose of an exposure beam. Referring to FIGS. 21 and 22, in the case of performing lithography using a beam having the same slope (e.g., e°) as the slope of the fifth contact 400 (e.g., f°) by controlling the illumination of the fifth contact 400, the diagonal pattern of the fifth contact 400 may be formed precisely. In the case where a slope of the center of the illumination light is the same as a slope f of the fifth contact 400 to be patterned, it is possible to easily perform the lithography in a diagonal shape.

That is, the fabricating method may include a source mask optimization (SMO) process for simultaneously performing optimization of the illumination of the fifth contact 400 to adjust a beam for lithography and optimization of the mask rather than simply performing optimization of the mask. According to this process, while a mask is easily produced, a diagonal pattern can be formed precisely at the same time. That is, in the fabricating method of the semiconductor device according to the embodiment of the present inventive concept, the fifth contact 400 having a diagonal shape can be easily patterned to secure a margin in accordance with the design rules. In addition, the steps of the process can be reduced by using one mask, thereby reducing the cost, and increasing the efficiency.

Referring again to FIG. 14, a portion which has been subjected to lithography is etched (step S430).

Since the lithography is positive lithography, a portion except the portion covered with the mask may be etched. This etching may be carried out by using dry etching. For example, reactive ion etching (RIE) may be used, but exemplary embodiments of the present inventive concept are not limited thereto.

The semiconductor device fabricated by the process may further include an interconnection structure including one or more metal lines and vias connecting the metal lines in the third direction Z. That is, the interconnection structure may be further formed selectively on the first to sixth contacts 300*a*, 300*b*, 300*c*, 300*d*, 400 and 500. By the formation of the interconnection structure, the first to sixth contacts 300*a*, 300*b*, 300*c*, 300*d*, 400 and 500 are selectively connected, thereby completing a logic cell performing a specific function.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A semiconductor device, comprising:
   first to fourth fins, each extending in a first direction, arranged to be spaced apart in a second direction intersecting the first direction;
   first and second gate lines, each extending in the second direction, arranged on the first to fourth fins to be spaced apart in the first direction;
   a first contact formed on the first gate line between the first and second fins;
   a second contact formed on the first gate line between the third and fourth fins;
   a third contact formed on the second gate line between the first and second fins;
   a fourth contact formed on the second gate line between the third and fourth fins; and
   a fifth contact formed on the first to fourth contacts so as to overlap with the second contact and the third contact and so as not to overlap with the first contact and the fourth contact,
   wherein the fifth contact is arranged to diagonally traverse a quadrangle defined by the first to fourth contacts.

2. The semiconductor device of claim 1, wherein the fifth contact passes through a point of symmetry of the quadrangle.

3. The semiconductor device of claim 2, wherein the fifth contact includes a first contact region connecting the point of symmetry to the second contact, and a second contact region connecting the point of symmetry to the third contact,
   wherein the first contact region has a convex shape in a direction away from the fourth contact, and
   wherein the second contact region has a convex shape in a direction away from the first contact.

4. The semiconductor device of claim 1, wherein the first to fifth contacts include at least one of metal and polysilicon.

5. The semiconductor device of claim 1, wherein the first gate line is electrically connected to the first and second contacts, wherein the second gate line is electrically connected to the third and fourth contacts.

6. The semiconductor device of claim 1, further comprising a fifth fin extending in a first direction, to be spaced apart from the first fin in a second direction, wherein the first and second gate lines are formed on the fifth fin; and
   a sixth contact that is not overlapped with the first to fourth fin, wherein the sixth contact is overlapped with the fifth fin.

7. The semiconductor device of claim 6, wherein the sixth contact is formed on sides of the first and second gate lines.

8. The semiconductor device of claim 6, wherein the fifth and sixth contacts are formed on the same level.

9. The semiconductor device of claim 6, further comprising a fin-shaped field effect transistor (fin-FET) including the first or second gate line,
   wherein the sixth contact is electrically connected to source/drain regions of the fin-shaped field effect transistor (fin-FET).

10. The semiconductor device of claim 1, wherein the first to fourth fins are spaced apart from each other at regular intervals.

11. A semiconductor device, comprising:
   first to fourth fins, each extending in a first direction, arranged to be spaced apart in a second direction intersecting the first direction;
   first and second gate lines, each extending in the second direction, arranged on the first to fourth fins to be spaced apart in the first direction; and
   a diagonal contact on the first and second gate lines and extending in third direction intersecting the first and second directions, wherein a first end of the diagonal contact connects to the first gate line, wherein a second end of the diagonal contact connects to the second gate line,
   wherein the diagonal contact is arranged to diagonally traverse a quadrangle defined by the first and fourth fins and the first and second gate lines.

12. The semiconductor device of claim 11, wherein the first end of the diagonal contact is between the third and fourth fins, and
   wherein the second end of the diagonal contact is between the third and fourth fins.

13. The semiconductor device of claim 11, wherein the diagonal contact passes through a point of symmetry of the quadrangle.

14. The semiconductor device of claim 11, wherein the diagonal contact include at least one of metal and polysilicon.

15. The semiconductor device of claim 14, wherein the diagonal contact includes a first contact region connecting the point of symmetry to the first end of the diagonal contact, and a second contact region connecting the point of symmetry to the second end of the diagonal contact,
   wherein the first contact region has a convex shape in a direction away from the second gate line, and
   wherein the second contact region has a convex shape in a direction away from the first gate line.

16. The semiconductor device of claim 11, further comprising a first contact formed on the first gate line; and
   a second contact formed on the second gate line.

17. The semiconductor device of claim 11, further comprising third and fourth gate lines, each extending in the second direction, arranged on the first to fourth fins to be spaced apart in the first direction, wherein the first and second gate lines are between the third and fourth gate lines.

18. The semiconductor device of claim 17, wherein the diagonal contact does not connect to the third and fourth gate lines.

19. The semiconductor device of claim 11, wherein the diagonal contact overlaps with the second and third fins and does not overlap with the first and fourth fins.

20. The semiconductor device of claim 11, wherein the first to fourth fins are spaced apart from each other at regular intervals.

* * * * *